(12) United States Patent
Ina et al.

(10) Patent No.: US 6,559,924 B2
(45) Date of Patent: May 6, 2003

(54) ALIGNMENT METHOD, ALIGNMENT APPARATUS, PROFILER, EXPOSURE APPARATUS, EXPOSURE APPARATUS MAINTENANCE METHOD, SEMICONDUCTOR DEVICE MANUFACTURING METHOD, AND SEMICONDUCTOR MANUFACTURING FACTORY

(75) Inventors: Hideki Ina, Kanagawa (JP); Koichi Sentoku, Tochigi (JP); Takahiro Matsumoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/866,604

(22) Filed: May 30, 2001

(65) Prior Publication Data
US 2002/0018207 A1 Feb. 14, 2002

(30) Foreign Application Priority Data
Jun. 1, 2000 (JP) ......................................... 2000/164352

(51) Int. Cl.[7] .................... G03B 27/42; G03B 27/54; G01B 11/00
(52) U.S. Cl. ........................... 355/53; 355/67; 356/400
(58) Field of Search ............................. 355/53, 67, 77, 355/55; 356/399, 400, 401; 250/548; 364/468.28

(56) References Cited

U.S. PATENT DOCUMENTS

| 4,834,540 A | 5/1989 | Totsuka et al. .............. 356/401 |
| 4,886,974 A | 12/1989 | Ina ............................... 250/561 |
| 4,901,109 A | 2/1990 | Mitome et al. ................ 355/68 |
| 5,933,350 A | * 8/1999 | Fujimoto et al. ....... 364/468.28 |
| 6,151,120 A | 11/2000 | Matsumoto et al. ......... 356/399 |
| 6,341,007 B1 | * 1/2002 | Nishi et al. ..................... 355/53 |

FOREIGN PATENT DOCUMENTS

| JP | 2-130908 | 5/1990 |
| JP | 9-280186 | 10/1997 |
| JP | 63-032303 | 2/1998 |
| JP | 2000-88702 | 3/2000 |

* cited by examiner

*Primary Examiner*—Russell Adams
*Assistant Examiner*—Peter B. Kim
(74) *Attorney, Agent, or Firm*—Fitzpatrick, Cella, Harper & Scinto

(57) ABSTRACT

An alignment method includes the steps of (i) in order to expose a pattern of a first object onto a second object, measuring positions of a plurality of marks on the second object with a mark detection device and aligning the first and second objects with each other, and (ii) measuring shapes of the plurality of marks on the second object, thereby obtaining offsets that should be reflected in the measured values of the mark detection device. The shapes of the plurality of the marks are measured with a shape measurement device with no possibility of coming into contact with the mark, through calibration with reference to a shape measurement device with a possibility of coming into contact with the mark.

13 Claims, 15 Drawing Sheets

FIG. 19

| | |
|---|---|
| URL | http://www.maintain.co.jp/db/input.html |

TROUBLE DB INPUT WINDOW

OCCURRENCE DATE  2000/3/15  ~404
TYPE OF APPARATUS  * * * * * * * * *  ~401
SUBJECT  OPERATION ERROR (START-UP ERROR)  ~403
SERIAL NUMBER S/N  465NS4580001  ~402
DEGREE OF URGENCY  D  ~405

SYMPTOM  LED KEEPS FLICKERING AFTER POWER-ON  ~406

REMEDY  POWER ON AGAIN (PRESS RED BUTTON IN ACTIVATION)  ~407

PROGRESS  INTERIM HAS BEEN DONE  ~408

[SEND] [RESET]

| 410 | 411 | 412 |
|---|---|---|
| LINK TO RESULT LIST DATABASE | SOFTWARE LIBRARY | OPERATION GUIDE |

SEMICONDUCTOR DEVICE MANUFACTURING FLOW

ALIGNMENT METHOD, ALIGNMENT APPARATUS, PROFILER, EXPOSURE APPARATUS, EXPOSURE APPARATUS MAINTENANCE METHOD, SEMICONDUCTOR DEVICE MANUFACTURING METHOD, AND SEMICONDUCTOR MANUFACTURING FACTORY

FIELD OF THE INVENTION

The present invention relates to an alignment method, alignment apparatus, and profiler suitable for alignment and the like in a semiconductor manufacturing exposure apparatus between a microelectronic circuit pattern, e.g., an IC, LSI, or VLSI, formed on a reticle surface and a wafer, an exposure apparatus, semiconductor device manufacturing method, and semiconductor manufacturing factory using the alignment method, alignment apparatus, and profiler, and an exposure apparatus maintenance method.

Most exposure apparatuses currently used are called steppers or scanners. In this specification, the steppers and scanners are not discriminated, but are also described as "exposure apparatuses" for descriptive convenience unless they need to be specifically discriminated.

BACKGROUND OF THE INVENTION

As integrated circuits shrink in feature size and increase in integration degree, a semiconductor manufacturing projection exposure apparatus must be able to project and expose a circuit pattern on a reticle surface onto a wafer surface with a higher resolution. For this purpose, in consideration of the fact that the projecting resolution of a circuit pattern depends on the numerical aperture (NA) of a projection optical unit and the exposure wavelength, studies have been made on an exposure method in which the exposure wavelength is fixed and the NA of the projection optical unit is increased, and an exposure method in which the exposure wavelength is decreased, an i-line is preferred over a g-line and an excimer laser oscillation wavelength is preferred over the i-line wavelength, and 248- and 193-nm wavelengths, and moreover 157-nm wavelength are used as the laser oscillation wavelength. A projection exposure apparatus using a 193-nm exposure wavelength is already commercially available.

As the circuit patterns shrink in feature size, a demand for high-precision alignment between a wafer and a reticle on which an electronic circuit pattern is formed has also arisen. When aligning a reticle and wafer with each other, light (exposure light) that photosensitizes a resist applied on the wafer surface and light (to be referred to as "non-exposure light" hereinafter) that does not photo-sensitize the resist, e.g., light with a wavelength of 633-nm, which is the oscillation wavelength of an He—Ne laser, are often used. Conventionally, the alignment wavelength practically employed is mostly that of the non-exposure light, because it is not easily influenced by a semiconductor manufacturing process. More specifically, since a resist to be photosensitized by exposure light is absorbed by the exposure light, the exposure light is transmitted through the resist with a low transmittance, and sometimes the exposure light is not transmitted at all. When the exposure light is used for alignment, while it passes through the resist, is reflected by an alignment mark, and passes through the resist again, it sometimes becomes very weak to be used as an alignment signal. When the exposure light interferes with light reflected by the resist surface, interference fringes are formed on the detected image, leading to degradation in precision. This is because the light is reflected by the resist surface with a reflectance of approximately 4%, and light transmitted through the resist twice also has an intensity of the same level as this, forming interference fringes with a high visibility (brightness contrast).

In view of this, in Japanese Patent Laid-Open Nos. 63-32303, 2-130908, and the like, the present applicant has also proposed an alignment apparatus using non-exposure light that is transmitted through a resist with a high transmittance. Such an apparatus is already commercially available so its effect has been confirmed. This method is a so-called non-exposure light TTL Offaxis method, in which chromatic aberration in non-exposure light of a projection optical unit for transferring and projecting a reticle pattern onto a wafer is corrected in the wavelength width as an alignment optical unit. As described in the above references, most of the currently employed alignment methods are a method of forming an optical image of an alignment mark on a wafer on an image sensing element such as a CCD camera, and image-processing an electrical signal from the image sensing element, thereby detecting the wafer position. With this method, light is not attenuated even after it is transmitted through the resist twice. Thus, even if monochromatic light is used as the non-exposure light, the interference fringes formed by interference with the light reflected by the resist surface have a low visibility (brightness contrast). In the references, since monochromatic light is not used but light with a correction wavelength width of, e.g., 70 nm or more in half width, is used, the interference fringes are suppressed to a level that does not pose any problem.

As a method of eliminating a process error called WIS (Wafer Induced Shift) as one of alignment errors, the present applicant has proposed a system called offset analyzer. As an example of WIS, the shape of the alignment mark and the shape of a resist on the alignment mark become asymmetric due to a process error. In a planarizing process in a modern metal CMP (Chemical Mechanical Polishing) step and the like, the structure of the alignment mark often becomes asymmetric. This produces a rotation error as shown in FIG. 5 or a magnification error as shown in FIG. 6 in global alignment, leading to a serious problem as a decrease in precision.

In order to eliminate degradation in precision which is caused when an alignment mark shape becomes asymmetric due to the process, in the offset analyzer, before a wafer position necessary for alignment of a wafer and reticle relative to each other is to be performed with a non-exposure light TTL offaxis alignment detection system with a highly stable base line, the surface shapes of a plurality of identical marks on the wafer which are used for alignment are measured, outside an exposure apparatus with an alignment apparatus, with a profiler (stereoscopic measurement unit) such as an AFM (Atomic Force Microscope) before and after resist coating. An offset, with which the three-dimensional relative positional relationship between the mark shapes before resist coating and those after resist coating matches with a signal from the detection system of the alignment apparatus, is calculated. Then, the wafer and reticle are aligned with each other by using the calculated offset. In this manner, a system for measuring the surface shapes of the marks before and after resist coating outside an alignment apparatus (exposure apparatus) with a profiler such as AFM, and calculating an offset with which the three-dimensional relative positional relationship between the respective mark shapes matches with a signal from the detection system of the alignment apparatus, is called an offset analyzer.

FIG. 3 shows data obtained when actual alignment marks are measured with the AFM. These data are indicated as signals displayed to correspond to respective alignment marks AM in FIG. 3. These data are those obtained after resist coating. The structures of the alignment marks AM are those called metal CMP as shown in FIG. 4. As is seen from FIG. 3, regarding the surface shapes of the alignment marks AM at shots on the left, right, and center of the wafer W, although the surface shape of the alignment mark AM of the shot at the center is symmetrical, the surface shape of each of the left and right shots is asymmetric with the asymmetry being reversed between the left and right shots. This is WIS. Even when such WIS occurs, with an offset analyzer, a highly stable alignment method can be implemented at high precision with less base line fluctuation.

A profiler used in the offset analyzer may be an AFM, a probe type profiler, or an optical non-contact type profiler. Any profiler poses no problem as far as it satisfies the specifications.

Since the resist is transparent to a wavelength used by the optical profiler, it is difficult to correctly measure the resist surface with the optical profiler. Meanwhile, for example, with an AFM, the resist surface of a measurement target as an actual sample is measured on the basis of the atomic force between the resist surface and that portion of the AFM which is called a probe. Accordingly, measurement is not influenced by the transmittance of the resist. When an optical profiler is used, a confocal detection method or a method using a wavelength corresponding zero transmittance of a resist may be employed.

In an exposure method using a KrF laser, as the planarizing technique such as CMP is introduced, the resist thickness is reduced to half (about 0.5 $\mu$m) about 1 $\mu$m in i-line exposure. In the confocal detection method, since the optical path length is considered in terms with geometrical optics, the refractive index of the resist is almost 1.5, so the confocal detection method must be able to separate a thickness of 0.5/1.5=0.33 $\mu$m. However, a confocal detection method that can separate a thickness of 0.5/1.5=0.33 $\mu$m does not exist, and even if it does exist, it must have an oil-immersion objective having a numerical aperture NA of 0.9 or more. As a result, an error in the optical unit, e.g., an eccentric coma, tends to occur, making it difficult to perform high-precision detection. If a method using a wavelength that is not transmitted through a resist is employed, as this method depends on the characteristics of the resist, it cannot measure any resist. For example, with a KrF resist, since the transmittance decreases only around the exposure wavelength, an excimer laser is used for the light source of the profiler as well. This greatly increases the cost.

From the above reasons, conventionally, in an offset analyzer, an AFM or a probe type profiler is inevitably used to measure the resist surface. The AFM, probe type profiler, and optical profiler will be described later again.

SUMMARY OF THE INVENTION

In the prior art, when an AFM or probe type profiler is used in favor of the horizontal resolution, the wafer surface may be contaminated. This is because, with an AFM or probe type profiler, when the atomic force is not used as a measurement value, the probe used for performing this measurement sometimes comes into strong contact with the wafer surface. For example, with the AFM, as the name suggests, the atomic force is used as the measurement value.

As shown in FIG. 16, if an alignment mark AM of a wafer has such a shape that the distance between the AFM and the wafer decreases from the current measurement position to the next measurement point, a probe 2 of the AFM comes into strong contact with the wafer surface once, and a preset atomic force is not generated. Therefore, the probe 2 is separated after this to a position at such a distance that an atomic force can be obtained, and a measurement value is obtained. This distance often changes exceeding a value with which an atomic force is generated, although depending on the shape of the alignment. In practice, therefore, the probe 2 often comes into strong contact with the measurement surface. Then, the shape of the probe deforms and according the measurement value changes. This is one of the factors that determines the service life of the probe. The thinner the distal end of the probe, the shorter the service life.

The probe is made of a silicon-based material. Since this probe comes into strong contact with the process member of the wafer, a possibility of contamination cannot be denied. Even if contamination can be completely eliminated by washing after measurement, the washing time decreases the throughput, leading to another problem. The probe serves to measure a soft target such as a resist surface. Thus, if the probe comes into strong contact with the measurement target, it may damage the surface. In this case, the shape indicated by the measurement value and that obtained after strong contact may differ, and the original effect of the offset analyzer cannot be exhibited. In the following description, an AFM or probe type profiler will be expressed as "a profiler with a contact possibility", and a complete non-contact measurement profiler such as an optical profiler will be expressed as "a profiler with no contact possibility".

The present invention has been made in view of the above problems of the prior art, and has as its object to enable, in an alignment method, alignment apparatus, profiler, exposure apparatus, semiconductor device manufacturing method, semiconductor manufacturing factory, and exposure apparatus maintenance method, measurement of the shape of a mark without contaminating or damaging the mark.

In order to achieve the above object, an alignment method according to the present invention comprises the steps of:

in order to expose a pattern of a first object onto a second object, detecting a plurality of marks on the second object with mark detection means and aligning the first and second objects with each other;

measuring a shape of a mark on the second object before the step of aligning, thereby obtaining an offset that should be reflected in a detection result of the mark detection means, wherein the shape of the mark is measured with shape measurement means with no possibility of coming into contact with the mark, through calibration with reference to shape measurement means with a possibility of coming into contact with the mark.

Preferably, the above alignment method further comprises, for performing the calibration, the step of measuring shapes of the plurality of marks on the second object with the shape measurement means with contact possibility.

Preferably, in the above alignment method, the shape measurement means with contact possibility comprises an atomic force microscope or a probe type stereoscopic shape measurement unit.

Preferably, in the above alignment method, measurement of the shape of the mark is performed before and after coating the second object with a resist for exposure.

Preferably, in the above alignment method, the offset is obtained based on a result obtained through correspondence between a detection signal obtained by the mark detection means and a relative positional relationship between the shape of the mark before resist coating and that after resist coating, which are measured by performing calibration with the shape measurement means with no contact possibility.

Preferably, in the above alignment method, when the second object to be exposed comprises a plurality of second objects, the second objects which follow the first one of the second objects are also aligned by using the offset obtained by using the first one of the second objects.

Also, an alignment apparatus according to the present invention comprises:

in order to expose a pattern of a first object onto a second object alignment, means for detecting a plurality of marks on the second object with mark detection means and aligning the first and second objects with each other; and means for measuring a shape of a mark on the second object before alignment of the first and second objects, thereby obtaining an offset that should be reflected in a detection result of the mark detection means, wherein the shape of the mark is measured with shape measurement means with no possibility of coming into contact with the mark, through calibration with reference to shape measurement means with a possibility of coming into contact with the mark.

Also, a profiler according to the present invention comprises:

first shape measurement means for measuring the shape of the mark while having a possibility of coming into contact with the mark;

second shape measurement means for measuring the shape of the mark while having no possibility of coming contact with the mark; and calibration measurement means for performing calibration with reference to said first shape measurement means in order to measure the shape of the alignment mark with said second shape measurement means.

Preferably, in the above profiler, the calibration measurement means performs calibration based on a predetermined causal relationship, obtained by measuring the shape of the mark with the first and second shape measurement means before and after coating of the resist, while changing a coverage of the resist with respect to the mark by slightly changing a condition for a coater that coats the mark with a resist from an optimal one.

Preferably, in the above profiler the calibration measurement means performs calibration based on information concerning a thickness of the resist applied to the exposure target substrate.

Also, an exposure apparatus for exposing a pattern on a master mask onto a substrate according to the present invention, comprises:

an alignment apparatus for aligning the master mask and substrate with each other, the alignment apparatus comprising:

in order to expose a pattern of a first object onto a second object, alignment means for detecting a plurality of marks on the second object with mark detection means and aligning the first and second objects with each other, and means for measuring a shape of a mark on the second object before alignment of the first and second objects, thereby obtaining an offset that should be reflected in a detection result of the mark detection means, wherein the mark is measured with shape measurement means with no possibility of coming into contact with the mark, through calibration with reference to shape measurement means with a possibility of coming into contact with the mark.

Preferably, in the above exposure apparatus, the apparatus further comprises a display, a network interface, and a computer for executing network software, and maintenance information of the exposure apparatus can be communicated via a computer network.

Preferably, in the above exposure apparatus, the network software provides on the display a user interface connected to an external network of a factory where the exposure apparatus is installed to access a maintenance database provided by a vendor or user of the exposure apparatus, and enables obtaining information from the database via the external network.

Also, a semiconductor device manufacturing method according to the present invention comprises the steps of:

installing a plurality of semiconductor manufacturing apparatuses including an exposure apparatus at a semiconductor manufacturing factory; and manufacturing a semiconductor device by using the plurality of semiconductor manufacturing apparatuses, the exposure apparatus including an alignment apparatus for aligning a master mask and a substrate with each other, and the alignment apparatus comprising:

in order to expose a pattern of a first object onto a second object, alignment means for detecting a plurality of marks on the second object with mark detection means and aligning the first and second objects with each other, and means for measuring a shape of a mark on the second object before alignment of the first and second objects, thereby obtaining an offset that should be reflected in a detection result of the mark detection means, wherein the shape of the mark is measured with shape measurement means with no possibility of coming into contact with the mark, through calibration with reference to shape measurement means with a possibility of coming into contact with the mark.

Preferably, the above semiconductor device manufacturing method further comprises the steps of:

connecting the plurality of manufacturing apparatuses by a local area network;

connecting the local area network to an external network outside the factory;

obtaining information about the exposure apparatus from a database on the external network by utilizing the local area network and the external network; and controlling the exposure apparatus on the basis of the obtained information.

Preferably, in the above semiconductor device manufacturing method, a database provided by a vendor or user of the exposure apparatus is accessed via the external network to obtain maintenance information of the manufacturing apparatus by data communication, or production management is performed by data communication between the semiconductor manufacturing factory and another semiconductor manufacturing factory via the external network.

Also, a semiconductor manufacturing factory according to the present invention comprises:

a plurality of semiconductor manufacturing apparatuses including an exposure apparatus;

a local area network for connecting the plurality of semiconductor manufacturing apparatuses; and a gateway for connecting the local area network to an external network outside the semiconductor manufacturing factory, so that information about at least one of the plurality of semiconductor manufacturing apparatuses can be communicated, the exposure apparatus including an alignment apparatus for aligning a master mask and substrate with each other, the alignment apparatus comprising:

in order to expose a pattern of a first object onto a second object, alignment means for detecting a plurality of marks on the second object with mark detection means and aligning the first and second objects with each other, and means for measuring a shape of a mark on the second object before alignment of the first and second objects, thereby obtaining an offset that should be reflected in a detection result of the mark detection means, wherein the mark is measured with shape measurement means with no possibility of coming into contact with the mark, through calibration with reference to shape measurement means with a possibility of coming into contact with the mark.

Also, an exposure apparatus maintenance method comprises the steps of:

causing a vendor or user of the exposure apparatus to provide a maintenance database connected to an external network of a semiconductor manufacturing factory;

authorizing access from the semiconductor manufacturing factory to the maintenance database via the external network; and transmitting maintenance information accumulated in the maintenance database to the semiconductor manufacturing factory via the external network, the exposure apparatus includes an alignment apparatus for aligning a master mask and substrate with each other, the alignment apparatus comprising:

in order to expose a pattern of a first object onto a second object, alignment means for detecting a plurality of marks on the second object with mark detection means and aligning the first and second objects with each other, and means for measuring a shape of a mark on the second object before alignment of the first and second objects, thereby obtaining an offset that should be reflected in a detection result of the mark detection means, wherein the shape of the mark is measured with shape measurement means with no possibility of coming into contact with the mark, through calibration with reference to shape measurement means with a possibility of coming into contact with the mark.

In the above arrangements, the mark shape is measured with a shape measurement means with no possibility of coming into contact with the mark. In measurement, since the measurement means is subjected to calibration with reference to a shape measurement means with a possibility of coming into contact with the mark, the mark shape is measured without coming into contact with the first object. Therefore, the first object will not be contaminated or damaged.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 19 is a view showing an example of a user interface;

DETAILED DESCRIPTION OF THE PREFERRED EMBODIMENTS

Preferred embodiments of the present invention will now be described in detail in accordance with the accompanying drawings.

According to a preferred embodiment of the present invention, to align a reticle as the first object and a wafer as the second object relative to each other, the position of the wafer is detected with a non-exposure light TTL offaxis alignment detection system with a high base line stability. Prior to this detection, the shapes of a plurality of identical marks on the wafer which are used for alignment are measured outside an exposure apparatus with an alignment apparatus with a profiler with no contact possibility before and after resist coating. This profiler and a profiler with a contact possibility, e.g., an AFM, have been subjected to calibration in advance for the respective steps, so an offset is obtained. This offset is reflected in the shape measurement result. By using this value, the relative positional relationship between the respective mark shapes before resist coating and those after resist coating, i.e., the three-dimensional relative positional relationship between a mark before resist coating and a resist applied on the mark by coating, is set to match a signal from the detection system of the alignment apparatus, and a corresponding offset amount is calculated. By using this offset value, the wafer and reticle are aligned with each other, so degradation in precision, which occurs when an alignment mark shape becomes asymmetric due to the process described above, is eliminated.

The embodiment of the present invention will be described with reference to the accompanying drawings. Note that although an alignment scope and offset analyzer as the detection systems of an exposure apparatus and alignment apparatus, which will be described hereinafter, are identical in their names to those already proposed by the present applicant, they have different arrangements. In this specification, an offset analyzer is a system that measures the surface shape outside the alignment apparatus, i.e., outside the exposure apparatus with a profiler with no contact possibility and a profiler with a contact possibility before and after resist coating, and calculates an offset with which the three-dimensional relative positional relationship between a resist and wafer mark matches a signal from the detection system of the alignment apparatus.

Figure 2:
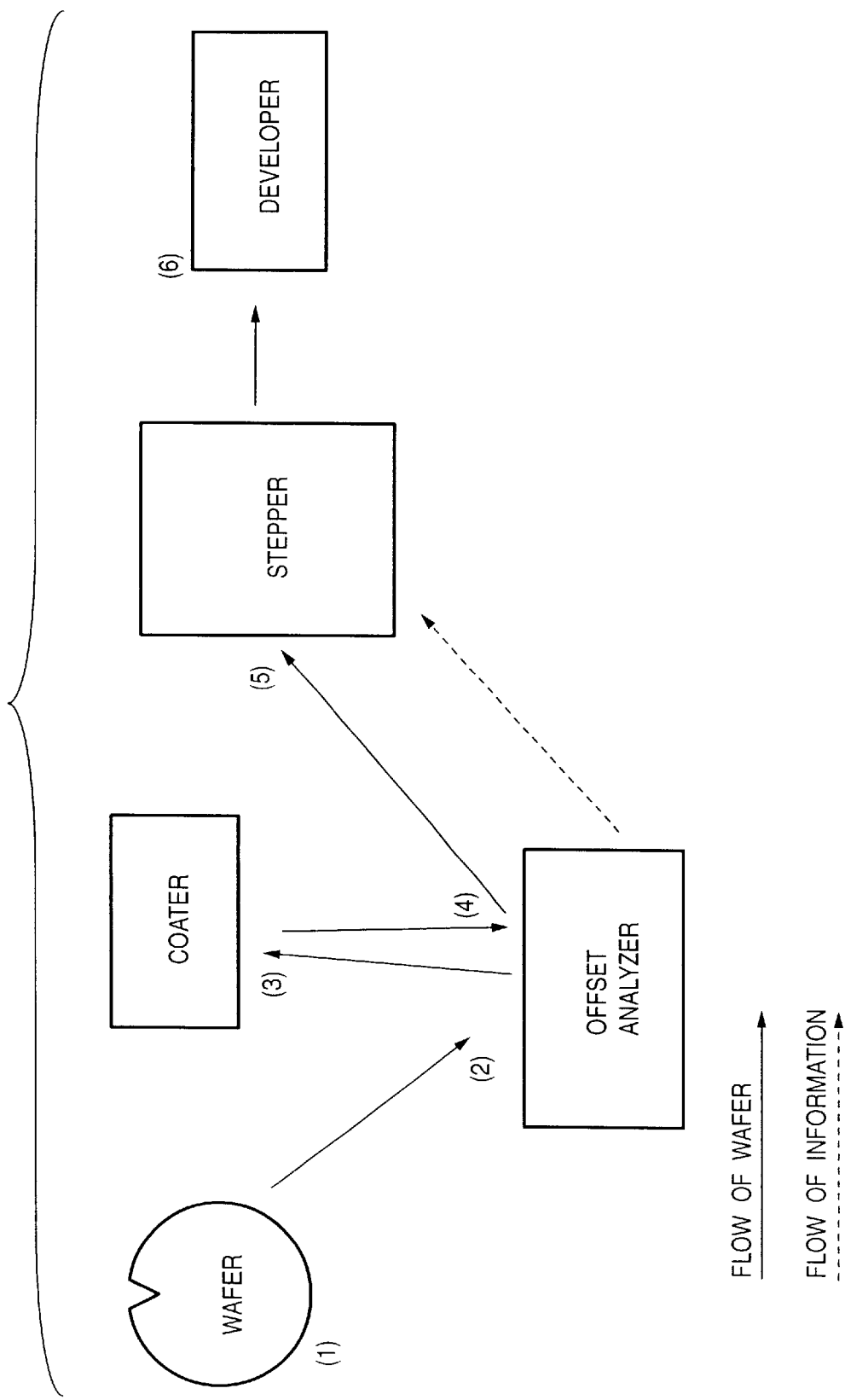
FIG. 2 is a view showing the flow of the wafer and information in the embodiment of the present invention.
Figure 3:
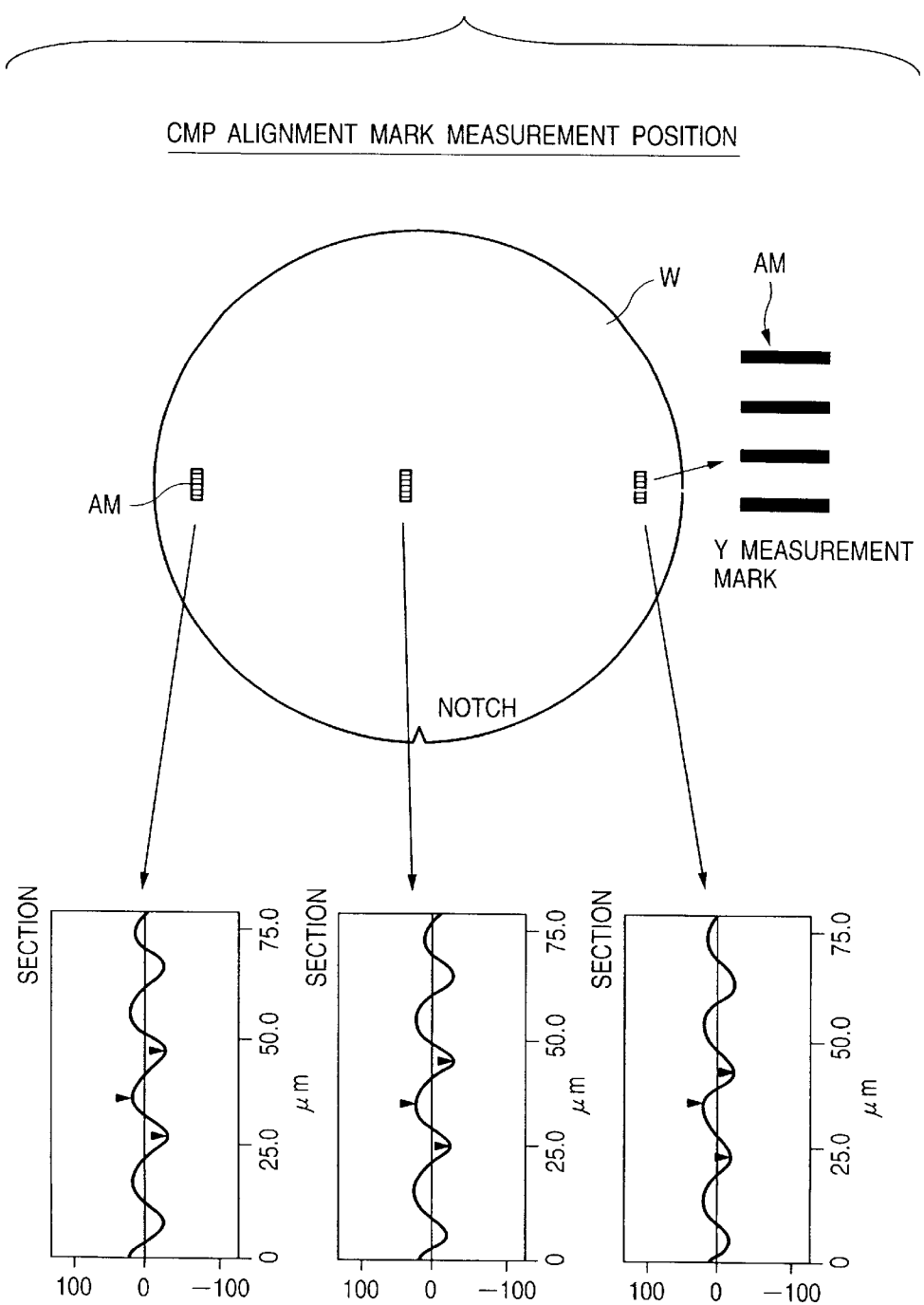
FIG. 3 is a view showing data obtained by measuring actual alignment marks with an AFM.
Figure 4:
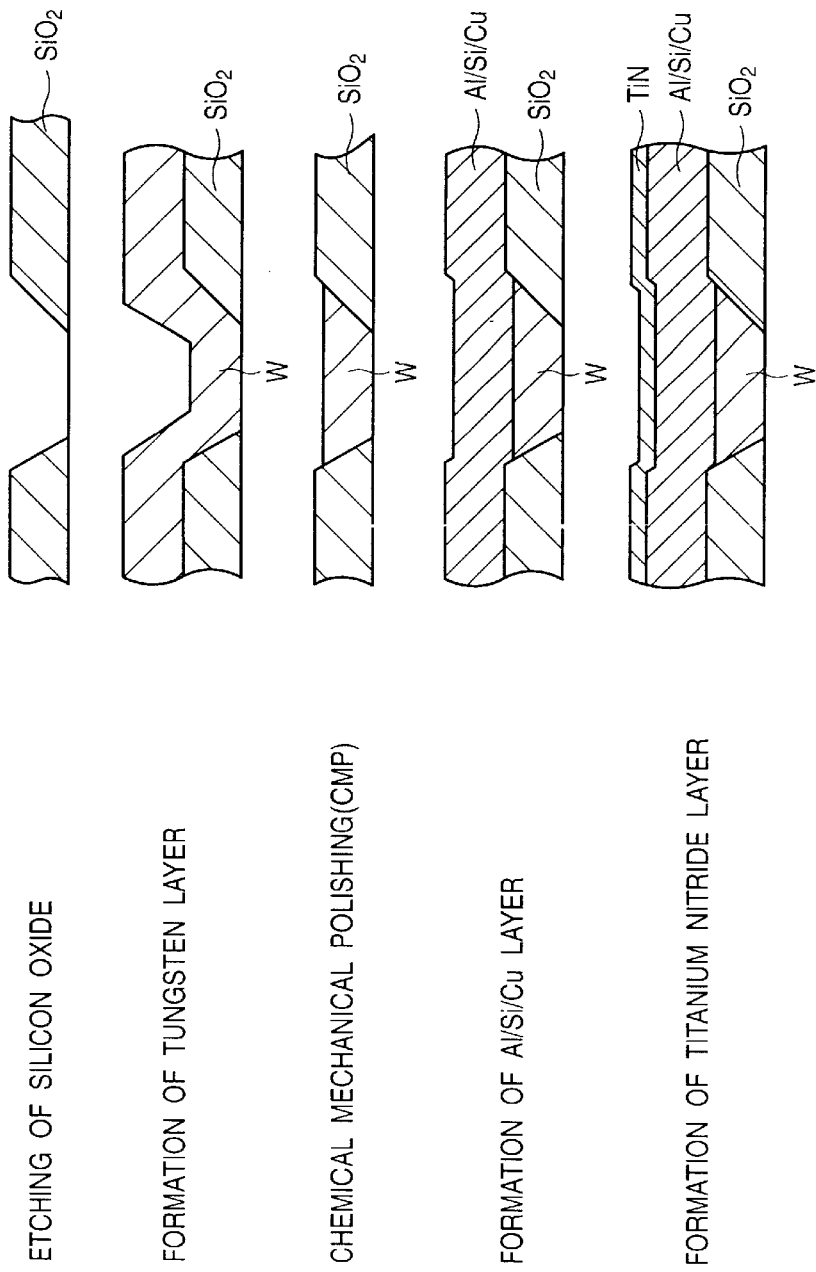
FIG. 4 is a view showing the structure of an alignment mark called metal CMP.
Figure 5:
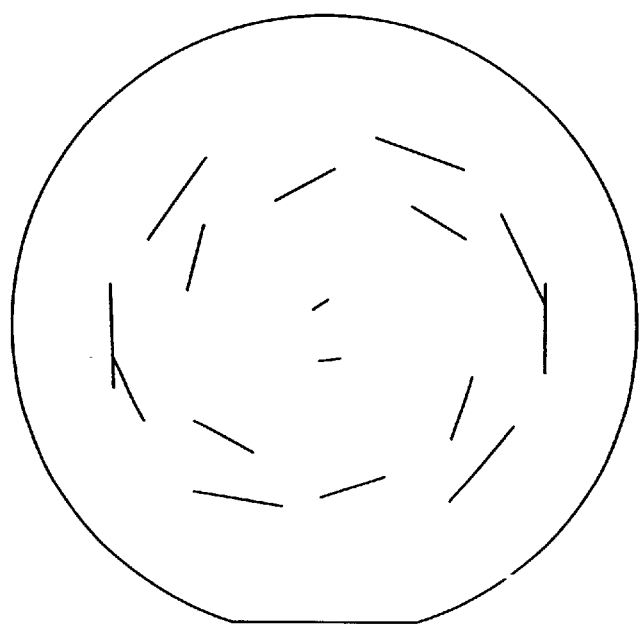
FIG. 5 is a view showing a case wherein a rotation error occurs as an alignment error.
Figure 6:
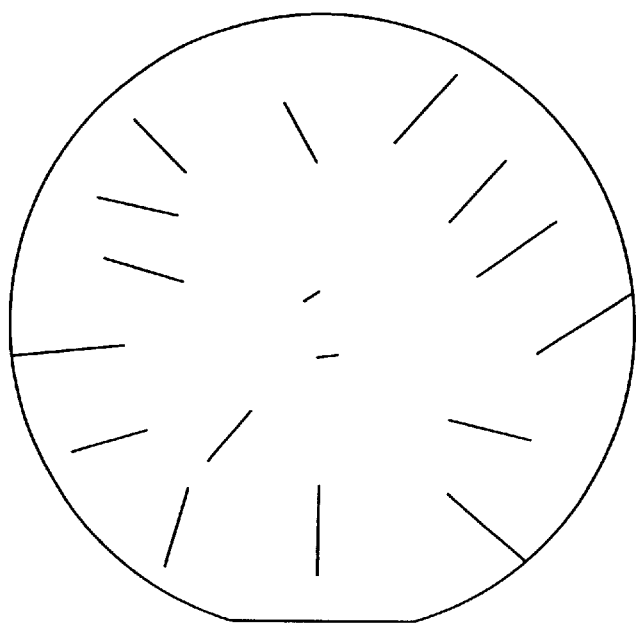
FIG. 6 is a view showing a case wherein a magnification error occurs as an alignment error.

FIG. 2 is a view showing the flow of the wafer and information in this embodiment. As shown in FIG. 2, before resist coating, the wafer is transferred to the offset analyzer ((1)→(2)), and the surface shape of an alignment mark on the wafer is measured with the profiler with no contact possibility. The wafer is then transferred to the coater ((2)→(3)), and is coated with a resist. The wafer is transferred to the offset analyzer again ((3)→(4)), and the surface shape of the resist on the alignment mark (the shape of the alignment mark after resist coating) is measured with the profiler with no contact possibility. A detection system formed in the offset analyzer and identical to the alignment scope of the exposure apparatus detects a signal from the alignment mark.

The offset analyzer calculates the amount of offset generated by a signal simulator. More specifically, first, the three-dimensional position of the resist (the shape of the alignment mark after resist coating) and that of the wafer mark (the shape of the alignment mark before resist coating) relative to each other must be set to match each other. In other words, the three-dimensional relative positional relationship between the resist and wafer mark is changed. A relationship with which the simulation result obtained by the signal simulator coincides with the signal from the alignment mark detected by the above detection system is defined as the three-dimensional relative positional relationship between the resist and wafer mark. By using this relative relationship, an alignment signal is obtained. An offset of alignment measurement is calculated from the alignment signal, and is supplied to the exposure apparatus.

Based on this offset, the exposure apparatus aligns and exposes the wafer. When exposure operations of all shots are ended, the wafer is transferred to the developer ((5)→(6)), and is developed.

Figure 1:
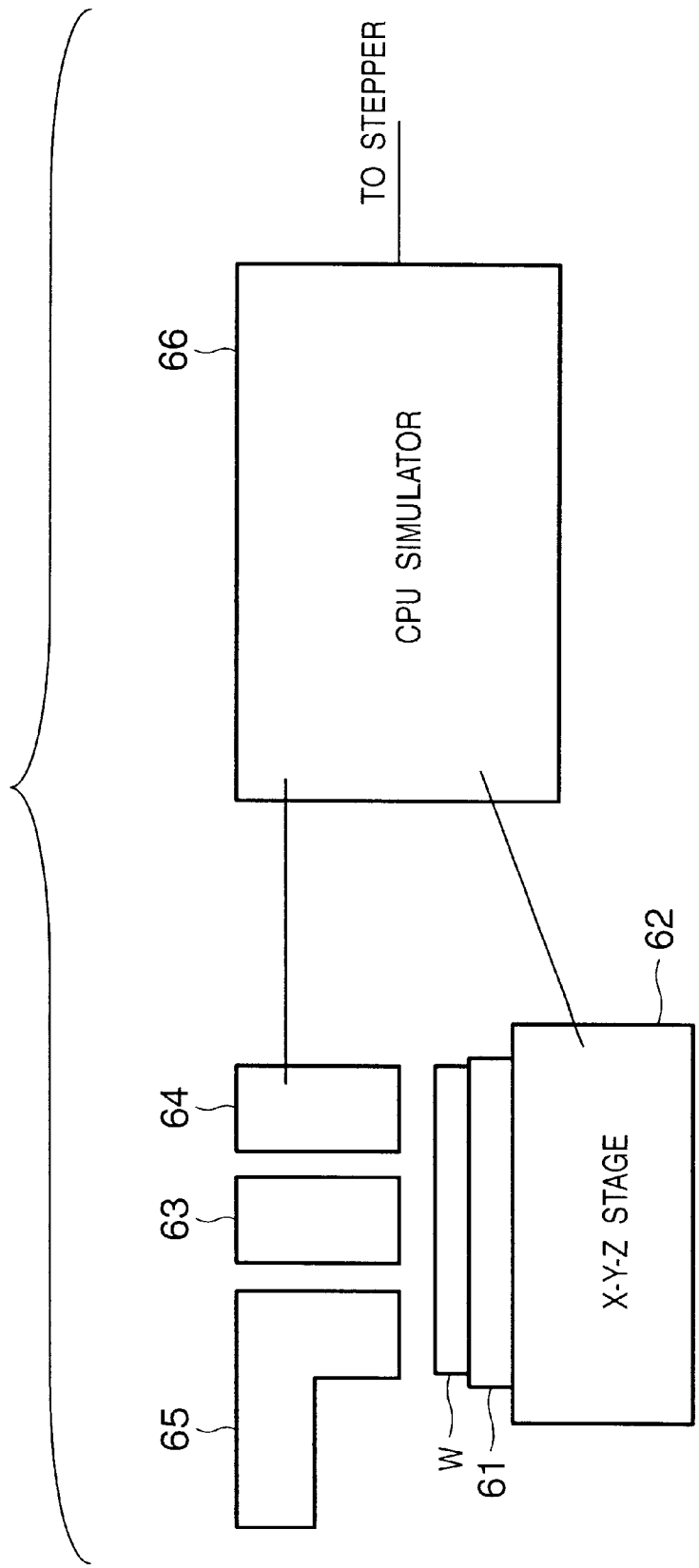
FIG. 1 is a view showing the arrangement of an offset analyzer shown in FIG. 2.

FIG. 1 shows the arrangement of the offset analyzer. As shown in FIG. 1, this offset analyzer has a chuck 61 for supporting a wafer W, an X-Y-Z stage 62 for moving the chuck 61 in the X, Y, and Z directions, an optical profiler 63 with no contact possibility which measures the surface shape of the alignment mark on the wafer W before and after resist coating, a calibrating profiler 64 with a contact possibility, e.g., an AFM, a detection system 65 identical to the alignment scope of the exposure apparatus, and a CPU 66 which controls the entire offset analyzer and has a simulator for calculating an alignment offset from the surface shape of the alignment mark. A wafer transfer system and wafer stereoscopic position detection system are not shown.

The offset analyzer must have information necessary for managing an apparatus error (TIS: Tool Induced Shift) between its detection system and the alignment scope of the exposure apparatus. For example, the coma of an optical system the uniformity of an illumination system or the like corresponds to this information. In place of providing such information to the offset analyzer, in the alignment scope of the exposure apparatus, the apparatus error may be reduced to a negligible degree. Alternatively, the error of the alignment scope of the exposure apparatus may be set to have the same level as that of the alignment detection system of the offset analyzer. As a method of evaluating this apparatus error, the present applicant has already proposed a method as shown in Japanese Patent Laid-Open No. 2000-88702. The effect of this method is actually confirmed. If the offset analyzer has information on the apparatus error between its detection system and the alignment scope of the exposure apparatus, an alignment detection system identical to the alignment scope of the exposure apparatus may not be formed in the offset analyzer but, for example, the offset analyzer may use a bright field detection system and the exposure apparatus may use a dark field detection system, and an offset may be calculated by considering all errors between the bright and dark field detection systems with a simulator.

The offset analyzer is formed independently of the exposure apparatus serving as an exposure unit. In terms of throughput, it is effective to form a plurality of offset analyzers with respect to a plurality of exposure apparatuses, so the alignment offset can be calculated with a sequence that does not interfere with exposure of the exposure apparatus. The number of exposure apparatuses and that of the offset analyzers need not be equal.

In the offset analyzer, the result obtained by measuring the surface shape of the alignment mark with the profiler with no contact possibility is calibrated in advance for the respective steps with the profiler 64 with a contact possibility, e.g., an AFM, and a corresponding offset is calculated. An example of this will be described later.

Figure 7:
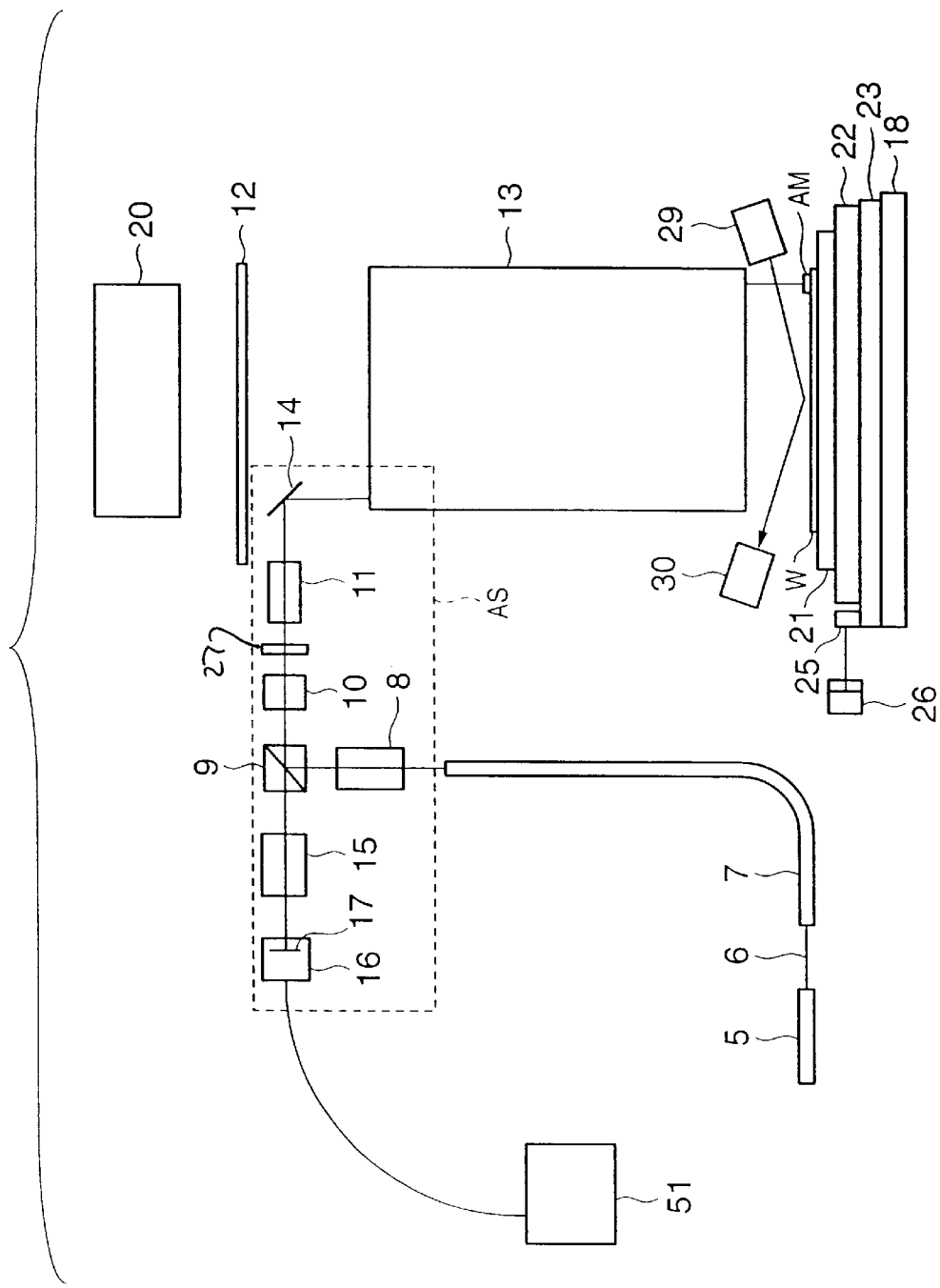
FIG. 7 is a schematic view showing the arrangement of an exposure apparatus on which an alignment detection system shown in FIG. 2 is mounted.

A non-exposure light TTL offaxis detection system formed in the exposure apparatus and with a stable base line will be described. As an example of this detection system, FIG. 7 shows, in an exposure apparatus, the alignment scope of a detection system that detects an alignment mark. This alignment scope has already been proposed by the present applicant.

The exposure apparatus shown in FIG. 7 is a KrF exposure apparatus with an exposure wavelength of 248 nm using the oscillation wavelength of a KrF excimer laser. In FIG. 7, reference numeral 13 denotes a projection optical system designed and manufactured such that the aberration becomes substantially zero at 248 nm. The projection optical system 13 has a large aberration for 633-nm oscillation light 6 as non-exposure light from, e.g., a He—Ne laser 5. The projection optical system 13 also has a very large on-axis aberration at about 633 nm. In an i-line exposure apparatus, the aberration of the alignment wavelength of this projection optical system is conversely corrected with an alignment detection system, so alignment with a width of 70 nm or more in half width is possible.

In the KrF exposure apparatus, as described above, since the on-axis aberration at about 633 nm is very large, when converse correction is to be performed, the correction optical system will undesirably have a size and assembly sensitivity almost equal to those of the projection optical system. Converse correction increases the apparatus size and cost and is not accordingly employed.

The alignment detection system shown in FIG. 7 has an aberration which is corrected only for the wavelength of 633 nm, and serves to perform alignment with an image using only ±1st-order diffracted beams of the alignment mark. In this detection system, the oscillation light 6 from the He—Ne laser 5 is guided by a fiber 7 to become incident on an illumination system 8 of an alignment scope As. After passing through a beam splitter 9, relay lens 10, plate 27, objective lens 11, and mirror 14, the incident light is transmitted through the projection optical system 13 to illuminate an alignment mark AM on a wafer W. Light reflected by the alignment mark AM is transmitted through the projection optical system 13, mirror 14, objective lens 11, plate 27, relay lens 10, and beam splitter 9 in an order reverse to that of incident light, forms an erecting image through an erector 15, and forms an image 17 on a CCD camera 16. The image 17 is photoelectrically converted by the CCD camera 16 and input to a computer 51 including a high-speed image processing electronic circuit. The computer 51 processes this signal by FFT (Fast Fourier Transform) and detects the position of the alignment mark AM from its phase. According to the TTL off-axis detection system with this arrangement, the base line length can be shortened, so an alignment detection system in which the base line stability is assured can be formed.

The wafer W is placed on a wafer chuck 21, and the wafer chuck 21 is formed on a θ-Z stage (driving means) 22. The wafer W is drawn by suction on the surface of the chuck 21, so the wafer W will not be positionally displaced by various types of vibrations. The θ-Z stage 22 is formed on a tilt stage 23 and vertically moves the wafer W in the focus direction (in the optical axis of the projection optical system 13). The tilt stage 23 is formed on an X-Y stage 18 controlled by a laser interferometer 26, and corrects the warp of the wafer W to be a minimum with respect to the image plane of the projection optical system 13. It is also possible to drive the X-Y stage 18 with only the tilt stage 23 in the focus direction. A bar mirror 25 formed on the tilt stage 23, and the laser interferometer 26 monitor the driving amount of the X-Y stage 18. The laser interferometer 26 transfers a measurement value concerning the driving amount to the computer 51 through a line.

Reference numeral 29 denotes a light-projecting system for forming a focus measurement system that positions the wafer W at the focus position of the projection optical system 13; and 30, a light-receiving system for the light-projecting system 29. In addition to focusing, the tilt of the shot surface with respect to the image surface of the projection optical system 13 is detected, and the detection result is corrected with the tilt stage 23. After focus measurement of the surface of the wafer W, the measurement value is transferred from the detection system 30 to the computer 51 through a line.

Reference numeral 12 denotes a reticle with an electronic circuit pattern; and 20, an illumination optical system for illuminating the reticle 12. The electronic circuit pattern on the reticle 12 illuminated by the illumination optical system 20 is exposed onto the wafer W through the projection optical system 13.

In this arrangement, in steps other than fast mask generation, when alignment is ended, the wafer magnification, perpendicularity, reduction magnification, and the like of the gratings in a shot on the wafer as a measurement target are calculated by using a correction value (offset) supplied from the offset analyzer. While driving the wafer chuck 21 or reticle stage on the basis of the calculation result, the electronic circuit pattern on the surface of the reticle 12 is sequentially exposed onto the wafer W.

A simulator in the offset analyzer which calculates the offset on the basis of the shape of the alignment mark AM before resist coating and that after resist coating will be described. Various types of simulators are available. As a general simulator on the market, EMFLEX manufactured by Weidlinger Associates, U.S.A. is available. This simulator calculates light propagation by solving Maxwell equations in a vector manner by the finite-element method, thereby clarifying the behavior of light as a signal from the alignment mark in an actual arrangement. The signal can naturally be simulated with conditions, including the aberration of the optical system, that match the conditions of the actual arrangement. This signal is subjected to various types of signal processing operations, e.g., FFT (Fast Fourier Transform) described above, and the position of the alignment mark AM is detected from the phase of the signal. These processing operations must have the same algorithm as that of processing in the actual exposure apparatus, as a matter of course.

This explanation applies to signal processing with the TTL detection system of the KrF exposure apparatus. If an offset analyzer with another arrangement is employed, the processing operation is not limited to FFT (Fast Fourier Transform). The TTL detection system can be implemented so as to cope with various types of image processing methods. As other commercially available software programs that can perform similar signal simulation, Avant!, MetroPole, and the like are available.

Figure 8:
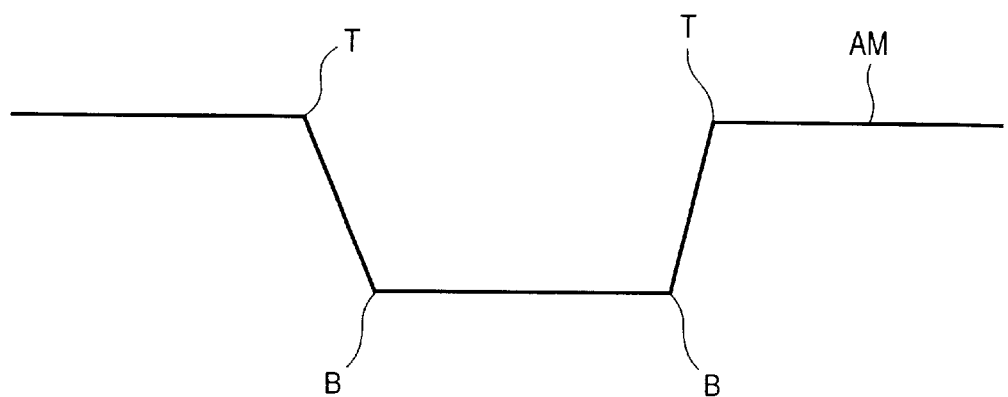
FIG. 8 is a view showing the sectional shape of an asymmetric alignment mark.

It is necessary to define a position where an offset occurs in the alignment mark AM. This idea is identical to an idea that has already been proposed by the present applicant. More specifically, as shown in FIG. 8, when the alignment mark AM is asymmetric, whether the offset occurs for an upper portion T or lower portion B of the alignment mark AM, or to an average of the upper and lower portions T and B, is determined in advance, and the offset analyzer performs processing with this assumption. An offset for the upper portion T, lower portion B, or the average of the upper and lower portions T and B can be obtained as the information.

Figure 9:
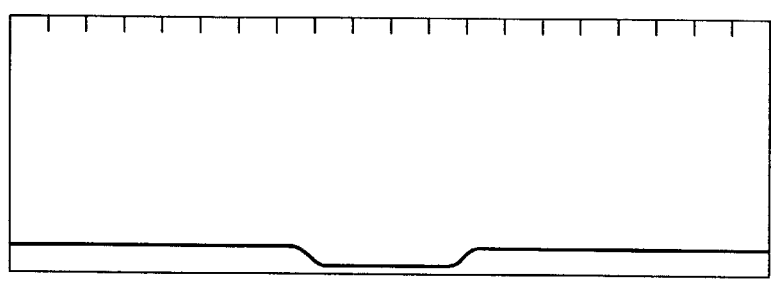
FIG. 9 is a graph showing data which is obtained by measuring the shape of an alignment mark with an optical profiler before resist coating.
Figure 10:
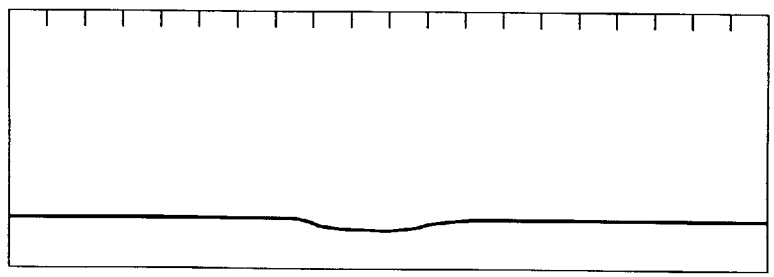
FIG. 10 is a graph showing data which is obtained by calibrating data, obtained by measuring the shape of an alignment mark with the optical profiler after resist coating.
Figure 11:
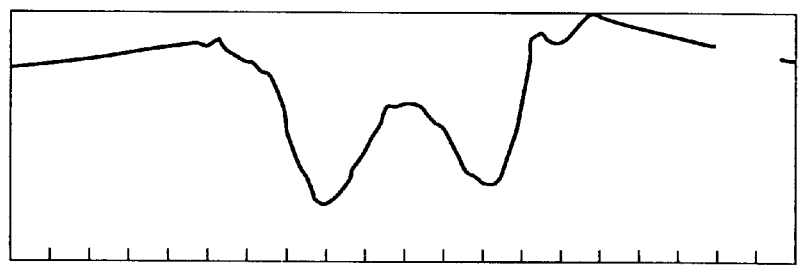
FIG. 11 is a graph showing a signal obtained by calculating an alignment signal from information, obtained before and after resist coating, with a simulator.

An actual calculation will be described with reference to FIGS. 9 to 11. FIG. 9 shows data which is obtained by measuring the alignment mark with the optical profiler 63 before resist coating. FIG. 10 shows data which is obtained by calibrating data obtained by measuring the alignment mark AM with the optical profiler 63 after resist coating. FIG. 11 shows a signal obtained by calculating an alignment signal from information, obtained before and after resist coating shown in FIGS. 9 and 10, with the simulator. In this case, a signal is simulated as a bright field image.

An example will be described, in which a result obtained by measuring the surface shape of the alignment mark AM with the optical profiler 63 with no contact possibility is calibrated by the profiler 64 with the contact possibility, e.g., an AFM, for the respective steps in advance, thereby calculating an offset in measurement. In particular, a case wherein an optical profiler using a Mirau interferometer (to be described later) is employed as the optical profiler 63 with no contact possibility will be described.

Figure 12:
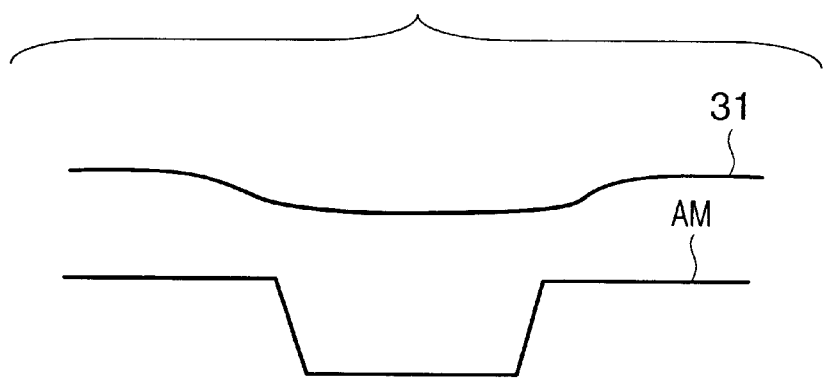
FIG. 12 is a sectional view showing the section of an alignment mark formed by an Si etching step after resist coating.
Figure 13:
FIG. 13 is a sectional view showing the section of an alignment mark formed by the Si etching step before resist coating.

Assume that an alignment mark AM with an Si step structure is coated with a resist 31 as shown in FIG. 12. FIG. 13 shows the sectional structure before coating with the resist 13. As the surface shape before coating, the same result can be obtained between a case wherein it is measured with the optical profiler 63 and a case wherein it is measured with the profiler 64 with a contact possibility. This is because when the surface shape is measured with the optical profiler 63, most measurement light is reflected by the surface of the Si alignment mark AM. In contrast to this, as shown in FIG. 12, after resist coating, since the transmittance of the resist is as high as 60% or more for, e.g., a wavelength of 633 nm, the measurement result differs between a case wherein the resist surface shape is measured with the optical profiler 63 and a case wherein the resist surface is measured with the profiler 64. This is because while the profiler 64 measures the resist surface, the optical profiler 63 measures the Si surface through the resist.

The optical profiler 63 must therefore be calibrated with reference to the optical profiler 64 by obtaining a calibration amount with which the result measured by the optical profiler 63 matches the result measured by the profiler 64 by also using information obtained before resist coating. For example, when the condition of the coater for applying the resist is slightly changed from the optimal one, the coverage of the resist with respect to the alignment mark changes. The changed coverage state can be measured by both the profiler 64 and optical profiler 63 to obtain a causal relationship between them, and a change in coverage can be used as the calibration amount. As the thickness of the resist sensitivity influences exposure, it is strictly managed in the lithography step. It is also possible to obtain the calibration amount on the basis of information on the resist thickness. If this resist thickness is used, a refractive index is obtained. Thus, the refractive index need not be separately obtained with an ellipsometer or the like, but it is effective to use a value obtained as the resist thickness for signal simulation.

Therefore, this calibration is performed for the respective steps in the semiconductor manufacture, so the calibration amount is obtained in advance. When an actual throughput is necessary, the stereoscopic shape measurement of the alignment mark AM is performed with only the optical profiler 63. An offset may be calculated by using the calibration amount, thereby achieving the function of the offset analyzer at a high speed.

As the AFM that can be used as the profiler 64, a Dimension Metrology AFM manufactured by Digital Instrument, which is developed aiming at measurement of CD (Critical Dimension), e.g., line width, pitch and depth, angle of the side wall, and roughness, is available. The principle of vertical detection is as follows. Namely, the distal end (with a radius of 5 nm to 20 nm) of a probe is moved close to the surface of a measurement target until a position where the atomic force is effected, and this position of the probe is detected with a photosensor (with a vertical resolution of 0.8 nm). In the horizontal direction, a piezoelectric element is driven (with a horizontal resolution of 1 nm) within a range of 70 μm at maximum, thereby enabling stereoscopic shape measurement. As the measurement mode, a mode called tapping mode, which is not of the contact type or non-contact type, is effective, in which measurement is performed while vibrating the probe with a resonance frequency of 200 kHz to 400 kHz.

As the probe type profiler that can be used as the profiler 64, HRP240ETCH (HRP: High Resolution Profiler) manufactured by KLA-Tencor, which can measure the entire region of a 300-mm wafer, is available. The principle of vertical detection is as follows. Namely, the surface of the measurement target is traced with the distal end (with a radius of 40 nm) of a stylus, which functions in the same manner as the probe, with a very low probe pressure, and the position of the stylus is detected with an electrostatic capacitive sensor (with a vertical resolution of 0.02 nm). For measurement in the horizontal direction, a combination of a stage for driving (with a horizontal resolution of 1 nm) a microregion with a size of 90 μm at maximum by a piezoelectric element and a motor-driven stage for measuring a macroregion with a size of 300 mm at maximum is used. This allows stereoscopic shape measurement. Another mode called a dipping mode is also available. According to the dipping mode, a stylus is lowered onto a sample at a measurement point so it comes into contact with the sample with a predetermined pressure. After measurement, the stylus is lifted and moved in the measurement direction. After that, the stylus is lowered again. This mode enables measurement of a sample with a high aspect ratio.

Figure 14:
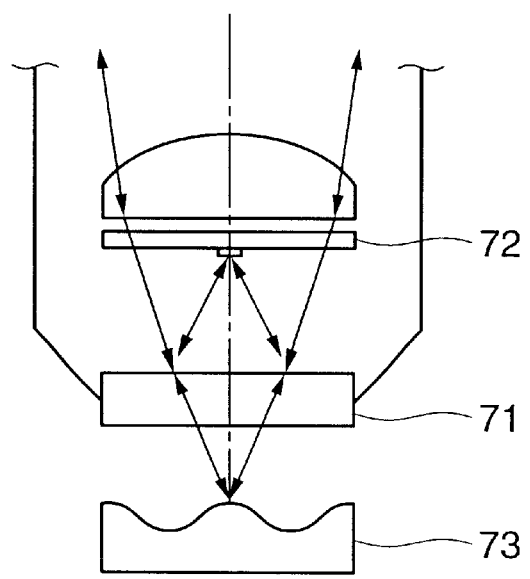
FIG. 14 is a view showing a portion in the vicinity of the objective lens of the Mirau interferometer shown in FIG. 15.
Figure 15:
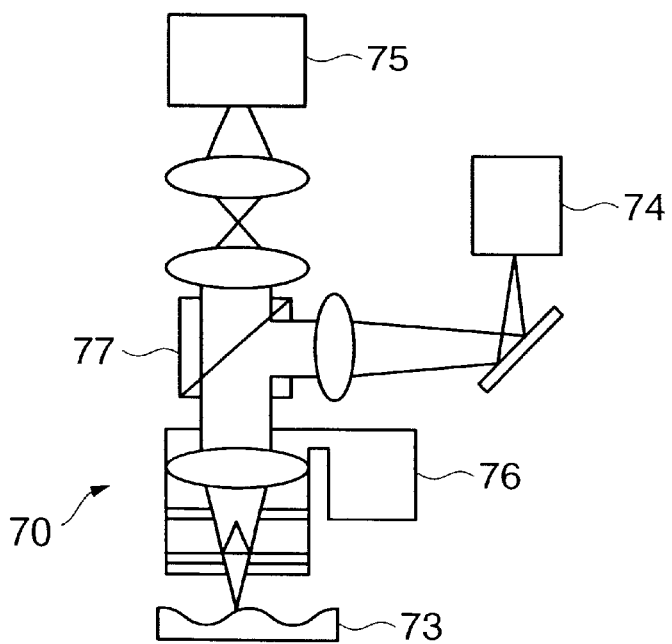
FIG. 15 is a view showing the entire apparatus of the Mirau interferometer.

As a profiler with no contact possibility, an optical profiler is available. As such an optical profiler, New View manufactured by Zygo, which is a three-dimensional surface structure analytic microscope, can be used. As the detection principle, this profiler employs the Mirau interferometer method as shown in FIGS. 14 and 15. FIG. 15 shows the overall structure of a Mirau interferometer apparatus, and FIG. 14 shows a Mirau interferometer type objective lens 70 shown in FIG. 15. As shown in FIG. 14, a half mirror 71 and internal reference mirror 72 for forming reference light are provided in the objective lens 70. This reference light and the light reflected by the surface of a measurement target 73 form an interference image on a CCD camera (light-receiving element) 74 placed on a plane optically conjugate with the surface of the measurement target 73. A halogen lamp is used as a light source 75, thus causing white light interference. If the wavelength filter is changed, monochromatic illumination may be obtained, so that phase measurement is also enabled. In the vertical direction, the objective lens 70 is driven by the piezoelectric element of a vertical scanning driving unit 76, and this driving position is controlled by a closed loop using an electrostatic capacitive sensor. Interference images formed on a plurality of focus planes are input to the computer and subjected to frequency region analysis using FFT (Fast Fourier Transform), uniquely developed by Zygo and called FDA (Frequency Domain Analysis), so they are transformed into height data with a vertical resolution of 0.1 nm. In the horizontal direction, the horizontal resolution (0.1 μm at maximum/Pix.) and detection range are determined by the image forming magnification of the optical system, from the measurement target 73 to the CCD camera 74, and the pixel pitch of the CCD camera 74.

As described above, when the alignment mark is measured with the TTL off-axis method by using non-exposure light and an offset generated in the alignment mark is calculated in advance with the offset analyzer, a high-precision, high-throughput alignment method is enabled, wherein degradation in precision, which occurs when the alignment mark shape becomes asymmetric due to the process, is prevented.

Calculation of the offset with the offset analyzer may be performed for all the wafers. Alternatively, for example, the offset may be obtained with only the sequence for the first wafer with a limited condition, and this offset may be used for the second and subsequent wafers. Naturally, the offset obtained with the first wafer is used for the second and subsequent wafers with only limited conditions, e.g., that the wafers belong to one lot, and when variations in asymmetry in the shape of the wafer alignment mark are small.

As described above, according to this embodiment, a sequence that uses the offset analyzer at least once or more can be performed. With the TTL off-axis method that uses non-exposure light, a high-precision, high-throughput alignment method can be realized, in which the problem of degradation in precision, which is caused when the distance between the off-axis microscope and the projection optical system, i.e., the so-called base line, fluctuates, is solved, and degradation in precision, which occurs when the alignment mark shape becomes asymmetrical due to the process, is prevented. In this alignment method, the offset analyzer can measure the shape of the alignment mark without contaminating or damaging the wafer.

The present invention is not limited to the above embodiment, but can be practiced in various modifications. For example, in the above description, the detection system 65 identical to the alignment scope of the exposure apparatus is also provided to the offset analyzer, as shown in FIG. 1, thereby obtaining an alignment signal. Alternatively, no detection system 65 may be provided, but an alignment signal may be obtained with the alignment detection system of the exposure apparatus. In this case, the alignment signal is obtained in the following procedure. Namely, a wafer is transferred to the exposure apparatus, and then an alignment signal is obtained with the alignment detection system of the exposure apparatus. Information on the alignment signal is supplied from the exposure apparatus to the offset analyzer. After that, an offset is calculated by the offset analyzer.

In the above embodiment, the offset analyzer according to the present invention is used in combination with the TTL off-axis method. However, the present invention is not limited to this. For example, when the offset analyzer is combined with an off-axis microscope, degradation in precision, which occurs when the alignment mark shape becomes asymmetrical due to the process, can be prevented. In this case, the off-axis microscope naturally needs a countermeasure against fluctuation in base line. A member which is not easily thermally affected must be used, or the base line must be corrected often.

In this manner, when the offset analyzer is used according to the present invention, degradation in precision, which occurs when the alignment mark shape becomes asymmetrical due to the process, can be prevented. Thus, high-precision, high-throughput alignment can be performed without being influenced by the semiconductor formation process such as CMP. Accordingly, complicated optimization in the process becomes unnecessary, enabling improvement in COO.

In the above description, the exposure unit that exposes a circuit pattern is expressed as an exposure apparatus. This expression is employed for descriptive convenience, as described in the Field of the Invention, and the present invention is naturally valid for alignment in all exposure methods, e.g., what is called a stepper, a scanner, one-to-one X-ray exposure, EB direct lithography, and EUV. This must be based on the premise that, when an alignment mark and resist shape, i.e., information on the mark shape before and after resist coating, becomes apparent, a signal from an alignment detection system formed in the exposure unit of a given exposure method can be calculated by signal simulation based on this information.

<Embodiment of Semiconductor Production System>

A production system for a semiconductor device (e.g., a semiconductor chip such as an IC or LSI, liquid crystal panel, CCD, thin-film magnetic head, micromachine, or the like) will be exemplified. A trouble remedy or periodic maintenance of a manufacturing apparatus is installed in a semiconductor manufacturing factory, or maintenance service such as software distribution is performed by using a computer network outside the manufacturing factory.

Figure 17:
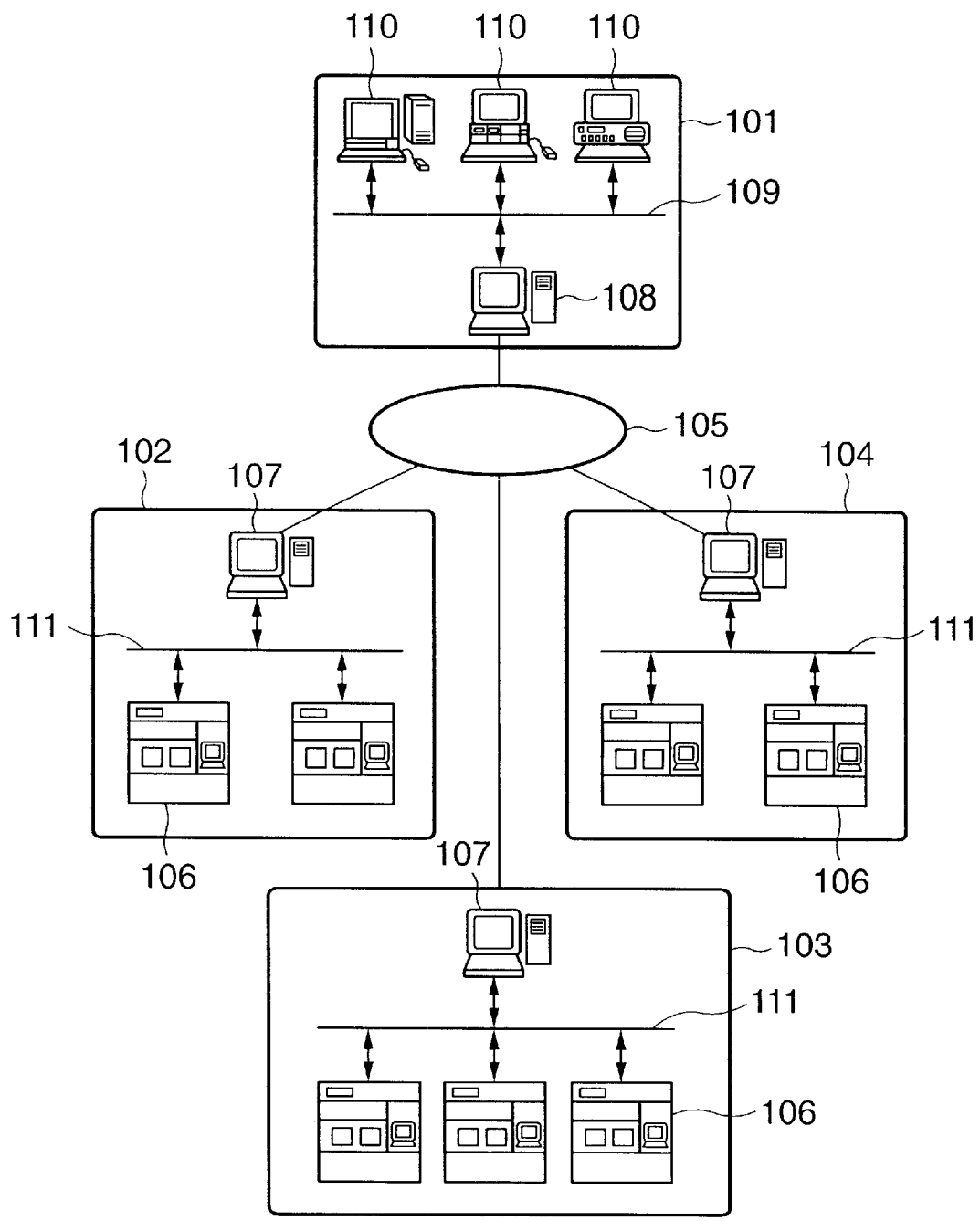
FIG. 17 is a view showing the concept of a semiconductor device production system when viewed from a given angle.

FIG. 17 shows the overall system cut out at a given angle. In FIG. 17, reference numeral 101 denotes a business office of a vendor (apparatus supply manufacturer) which provides a semiconductor device manufacturing apparatus. Assumed examples of the manufacturing apparatus are semiconductor manufacturing apparatuses for various processes used in a semiconductor manufacturing factory, such as pre-process apparatuses (lithography apparatus including an exposure apparatus, resist processing apparatus, and etching apparatus, annealing apparatus, film formation apparatus, planarization apparatus, and the like) and post-process apparatuses (assembly apparatus, inspection apparatus, and the like). The business office 101 comprises a host management system 108 for providing a maintenance database for the manufacturing apparatus, a plurality of operation terminal computers 110, and a LAN (Local Area Network) 109 which connects the host management system 108 and computers 110 to build an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (pre-process factory, post- process factory, and the like). Each of the factories 102 to 104 is equipped with a plurality of manufacturing apparatuses 106, a LAN (Local Area Network) 111 which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. More specifically, the factory notifies the vendor via the Internet 105 of status information (e.g., the symptom of a manufacturing apparatus in trouble) representing the operation status of each manufacturing apparatus 106, and receives response information (e.g., information designating a remedy against the trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated network (e.g., ISDN) having high security which inhibits access of a third party can be adopted. Also, the user may construct a database in addition to the one provided by the vendor and set the database on an external network, and the host management system may authorize access to the database from a plurality of user factories.

Figure 18:
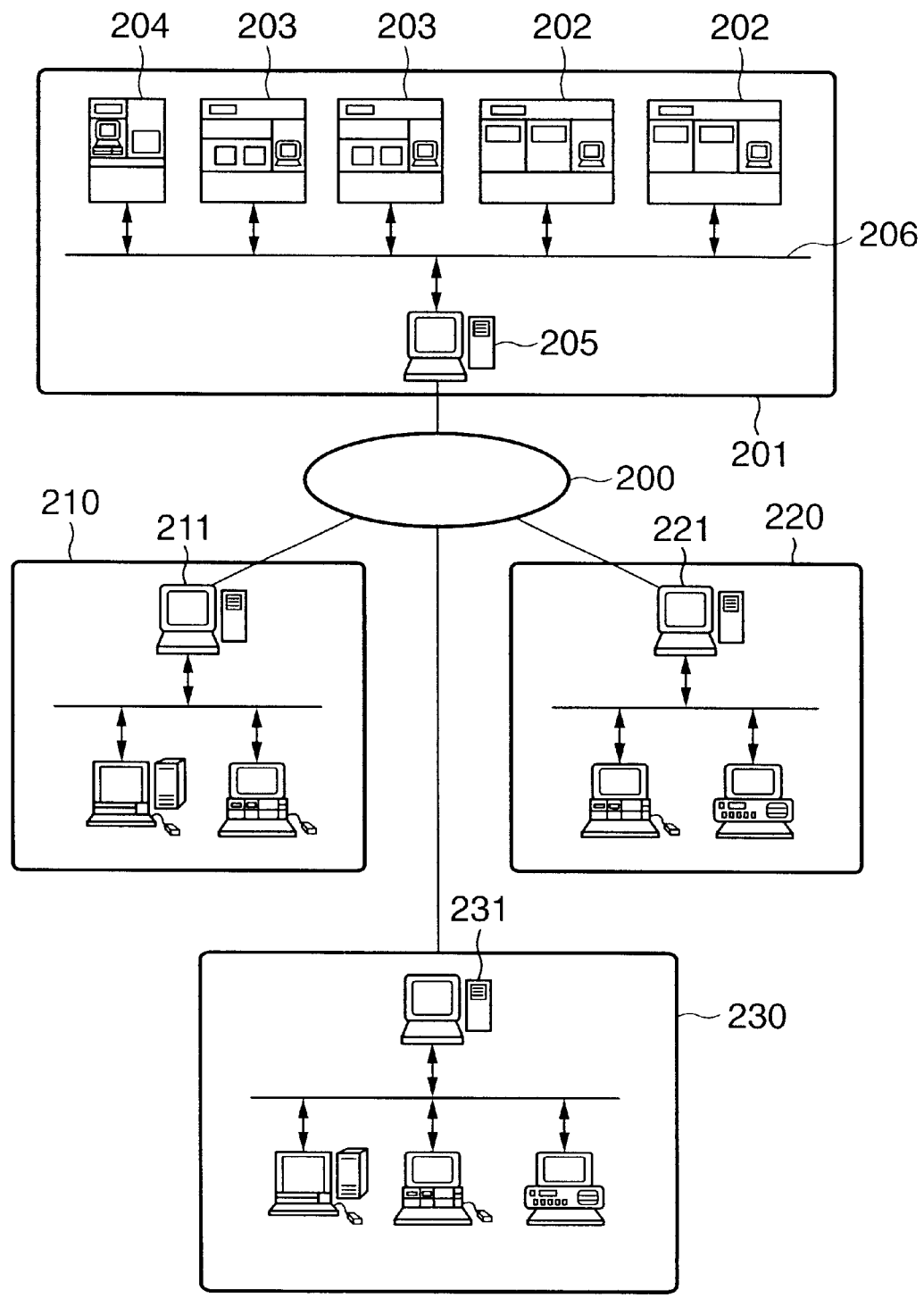
FIG. 18 is a view showing the concept of the semiconductor device production system when viewed from another given angle.

FIG. 18 is a view showing the concept of the overall system of this embodiment that is cut out at a different angle from that used for FIG. 17. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 18, a factory having manufacturing apparatuses of a plurality of vendors and the management systems of the vendors for these manufacturing apparatuses are connected via the external network of the factory, and maintenance information of each manufacturing apparatus is communicated. In FIG. 18, reference numeral 201 denotes a manufacturing factory of a manufacturing apparatus user (semiconductor device manufacturer) where manufacturing apparatuses for various processes, e.g., an exposure apparatus 202, resist processing apparatus 203, and film formation apparatus 204 are installed in the manufacturing line of the factory. FIG. 18 shows only one manufacturing factory 201, but a plurality of factories are networked in practice. The respective apparatuses in the factory are connected to a LAN 206 to build an intranet, and a host management system 205 manages the operation of the manufacturing line. The business offices of vendors (apparatus supply manufacturers) such as an exposure apparatus manufacturer 210, resist processing apparatus manufacturer 220, and film formation apparatus manufacturer 230 comprise host management systems 211, 221 and 231 for executing remote maintenance for the supplied apparatuses. Each host management system has a maintenance database and a gateway for an external network, as described above. The host management system 205 for managing the apparatuses in the manufacturing factory of the use, and the management systems 211, 221, and 231 of the vendors for the respective apparatuses are connected via the Internet or dedicated network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 19 on the display. While referring to this window, the operator who manages manufacturing apparatuses in each factory inputs, in input items on the windows, pieces of information such as the type of manufacturing apparatus (401), serial number (402), subject of trouble (403), occurrence date (404), degree of urgency (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 19. This allows the operator to access detailed information of each item, receive the latest-version software to be used for a manufacturing apparatus from a software library provided by a vendor, and receive an operation guide (help information) as a reference for the operator in the factory. Maintenance information provided by the maintenance database also includes information concerning the present invention described above. The software library also provides the software for implementing the present invention.

Figure 20:
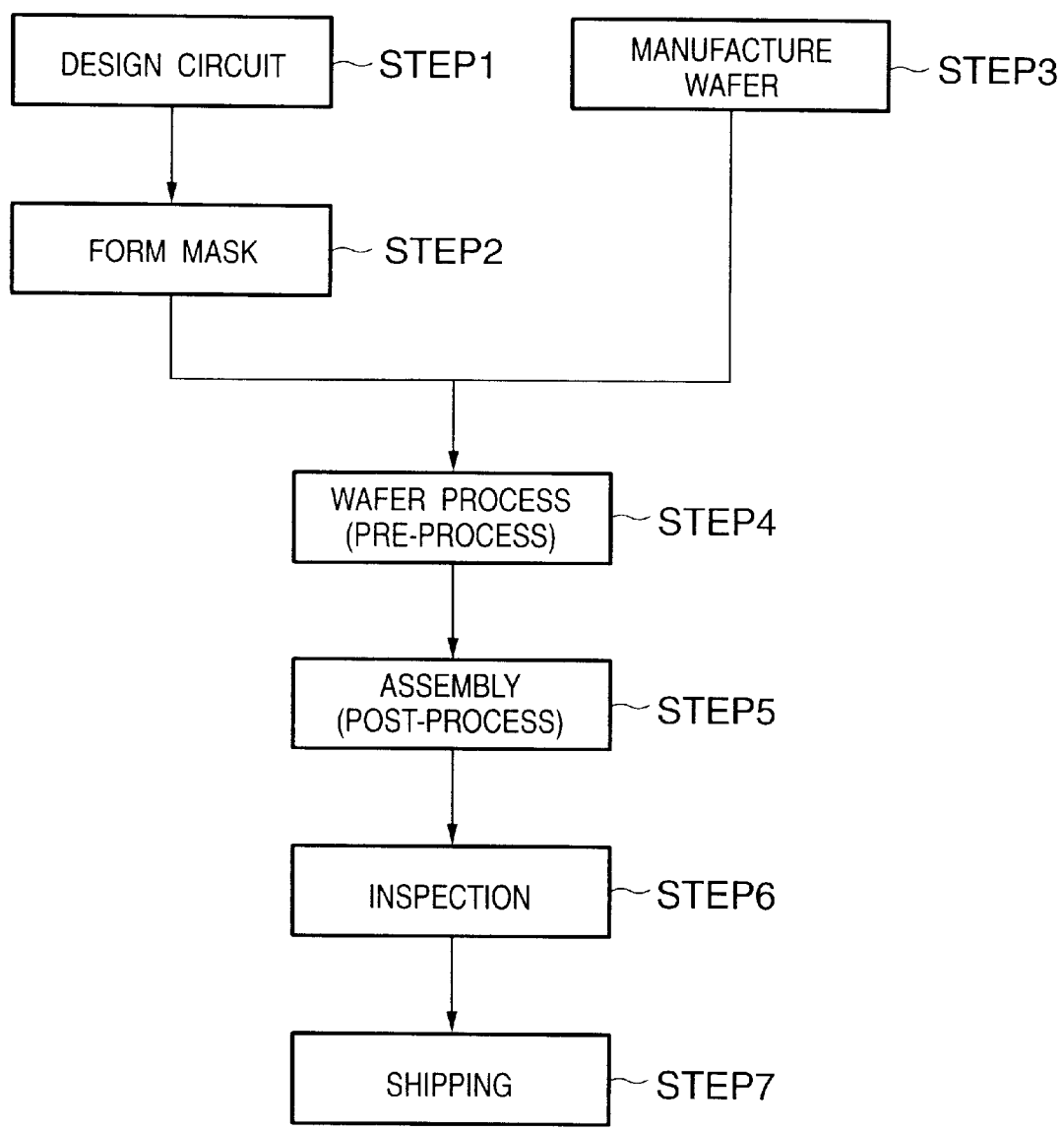
FIG. 20 is a flow chart for explaining the flow of a device manufacturing process.

A semiconductor device manufacturing process using the above-described production system will be explained. FIG. 20 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and packaging process (chip encapsulation). In step 6 (inspection), inspections such as the operation confirmation test and durability test of the semiconductor device manufactured in step 5 are conducted. After these steps, the semiconductor device is completed and shipped (step 7). The pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated network.

Figure 21:
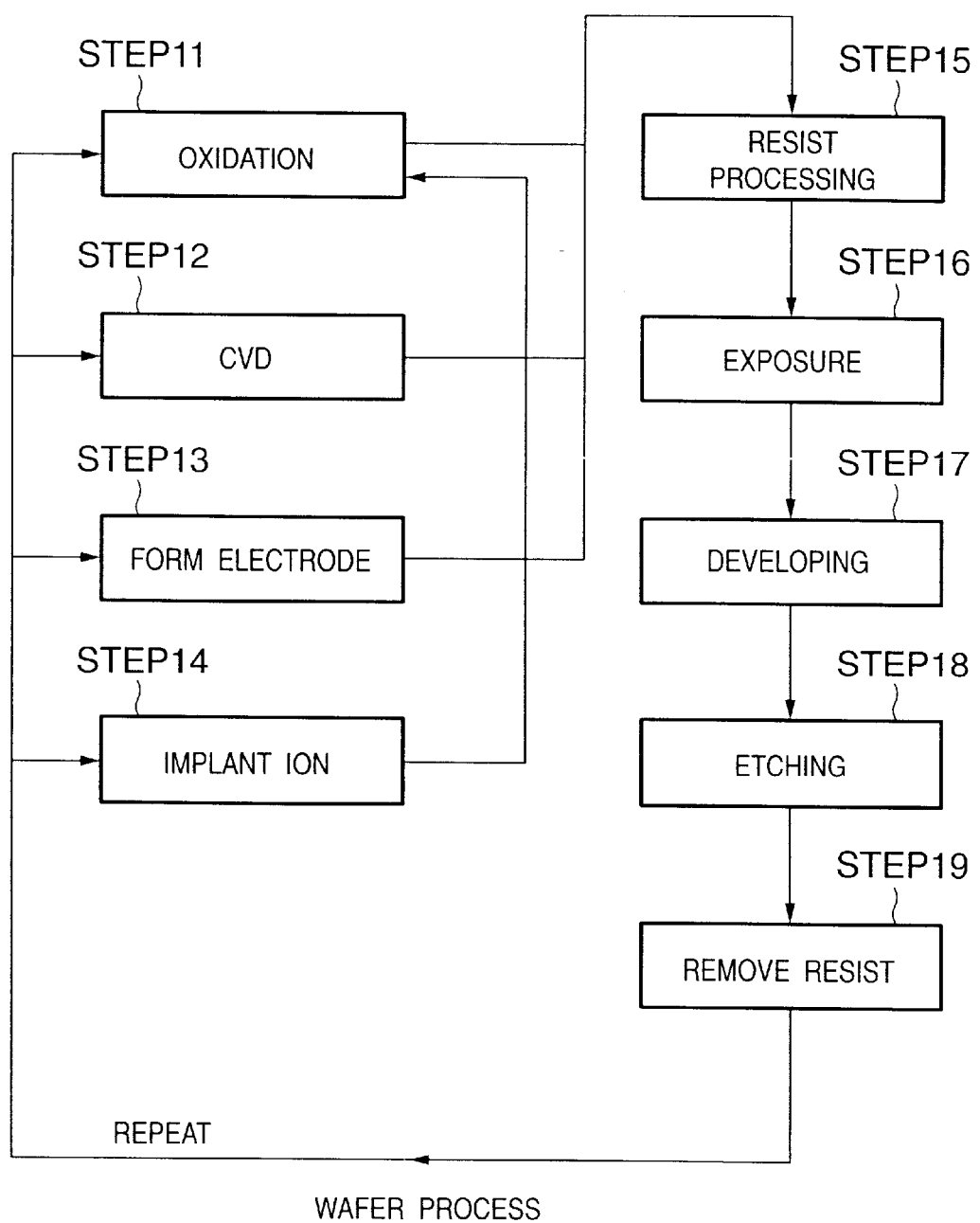
FIG. 21 is a flow chart for explaining the flow of a wafer process.

FIG. 21 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

A manufacturing apparatus used in each step undergoes maintenance by the above-described remote maintenance system, which prevents trouble in advance. Even if trouble occurs, the manufacturing apparatus can be quickly recovered. The productivity of the semiconductor device can be increased in comparison with the prior art.

As has been described above, according to the present invention, the shape of a mark on the first object is measured in advance to obtain an offset, and the first and second objects are aligned with each other to reflect this offset. In this alignment, the shape of the mark is measured with a shape measurement means with no possibility of coming into contact with the mark, by calibrating this shape measurement means with reference to a shape measurement means with a possibility of coming into contact with the mark. Therefore, the shape of the mark can be measured without contaminating or damaging the first object.

As a result, an offset which occurs when the mark on the first object is asymmetrical can be obtained without contaminating the first object or decreasing the throughput, so that stable, high-precision alignment of the first object can be performed without being influenced by the various types of processes.

As many apparently widely different embodiments of the present invention can be made without departing from the spirit and scope thereof, it is to be understood that the invention is not limited to the specific embodiments thereof except as defined in the appended claims.

What is claimed is:

1. An alignment method comprising the steps of:

in order to expose a pattern of a first object onto a second object, measuring positions of a plurality of marks on the second object with mark detection means and aligning the first and second objects with each other; and measuring shapes of the plurality of marks on the second object, thereby obtaining offsets that should be reflected in the measured values of the mark detection means, wherein the shapes of the plurality of the marks are measured with shape measurement means with no possibility of coming into contact with the mark, through calibration with reference to shape measurement means with a possibility of coming into contact with the mark.

2. The method according to claim 1, further comprising, for performing the calibration, the step of measuring shapes of the plurality of marks on the second object with the shape measurement means with contact possibility.

3. The method according to claim 1, wherein the shape measurement means with contact possibility comprises an atomic force microscope or a probe type three-dimensional shape measurement unit.

4. The method according to claim 1, wherein measurement of the shapes of the plurality of the marks is performed before and after coating the second object with a resist for exposure.

5. The method according to claim 4, wherein the offset is obtained based on a result obtained through correspondence between a detection signal obtained by the mark detection means and a relative positional relationship between the shape of the mark before resist coating and that after resist coating, which are measured by performing calibration with the shape measurement means with no contact possibility.

6. The method according to claim 1, wherein when the second object to be exposed comprises a plurality of objects, the objects which follow the first one of them are also aligned by using the offset obtained by using the first one of them.

7. An alignment apparatus comprising:

mark detecting means for measuring positions of a plurality of marks on an object; and means for measuring shapes of the plurality of marks on the object, thereby obtaining offsets that should be reflected in the measured values of the mark detection means, wherein the shapes of the plurality of the marks are measured with shape measurement means with no possibility of coming into contact with the mark, through calibration with reference to shape measurement means with a possibility of coming into contact with the mark.

8. A profiler for measuring a shape of an alignment mark on an exposure target substrate before and after coating with a resist, said profiler comprising:

first shape measurement means for measuring the shape of the mark while having a possibility of coming into contact with the mark;

second shape measurement means for measuring the shape of the mark while having no possibility of coming into contact with the mark; and calibration measurement means for performing calibration with reference to said first shape measurement means in order to measure the shape of the alignment mark with said second shape measurement means.

9. The profiler according to claim 8, wherein said calibration measurement means performs calibration based on a predetermined causal relationship, obtained by measuring the shape of the mark with said first and second shape measurement means before and after coating of the resist, while changing a coverage of the resist with respect to the mark by slightly changing a condition for a coater that coats the mark with a resist from an optimal one.

10. The profiler according to claim 8, wherein said calibration measurement means performs calibration based on information concerning a thickness of the resist applied to the exposure target substrate.

11. An exposure apparatus for exposing a pattern on a master mask onto a substrate, said apparatus comprising:

mark detecting means for detecting a plurality of marks on the substrate;

aligning means for aligning first and second objects with each other; and means for measuring shapes of the plurality of the marks on the substrate, thereby obtaining offsets that should be reflected in the measured values of the mark detection means, wherein the shapes of the plurality of the marks are measured with shape measurement means with no possibility of coming into contact with the mark, through calibration with reference to shape measurement means with a possibility of coming into contact with the mark.

12. The apparatus according to claim 11, further comprising:

a display;

a network interface; and a computer for executing network software, wherein maintenance information of the exposure apparatus can be communicated via a computer network.

13. The apparatus according to claim 12, wherein the network software provides on the display a user interface connected to an external network of a factory where the exposure apparatus is installed to access a maintenance database provided by a vendor or user of the exposure apparatus, and enables obtaining information from the database via the external network.

* * * * *

UNITED STATES PATENT AND TRADEMARK OFFICE
CERTIFICATE OF CORRECTION

PATENT NO.     : 6,559,924 B2
DATED          : May 6, 2003
INVENTOR(S)    : Hideki Ina et al.

It is certified that error appears in the above-identified patent and that said Letters Patent is hereby corrected as shown below:

Title page,
Item [56], References Cited, FOREIGN PATENT DOCUMENTS, the third-listed Japanese patent document "JP  63-032303  2/1998" should read
-- JP  63-032303  2/1988 --.

Figure 16:
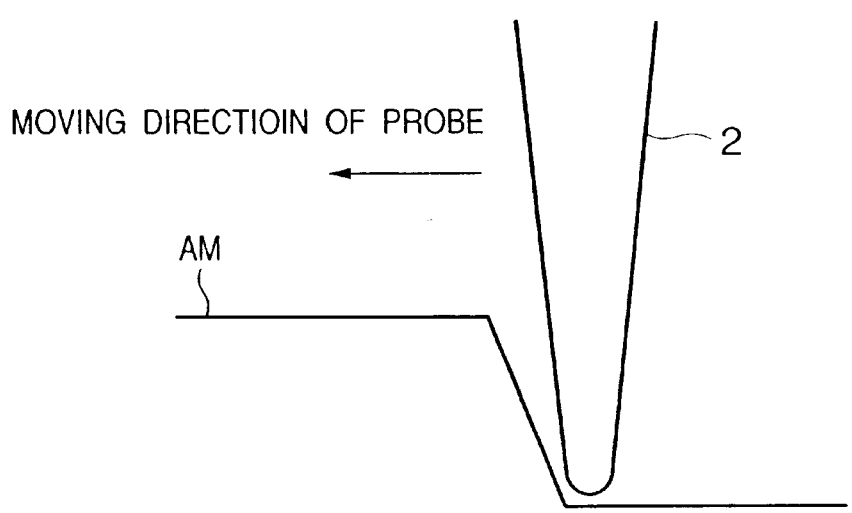
FIG. 16 is a view showing an AFM probe and a measurement sample.

Drawings,
Sheet 10, FIG. 16, "DIRECTIOIN" should read -- DIRECTION --.

Column 4,
Line 13, "according" should read -- accordingly --.

Column 5,
Line 36, "contact" should read -- into contact --.

Column 11,
Line 15, "employed" should read -- employed.
¶ In the KrF exposure apparatus shown in FIG. 7, an alignment detection system, the aberration of which is corrected only for the oscillation light 6 as the 633-nm monochromatic light from the He-Ne laser 5, is formed. This alignment detection system is already commercially available for use in actual semiconductor exposure. --.

Signed and Sealed this

Seventh Day of October, 2003

JAMES E. ROGAN
*Director of the United States Patent and Trademark Office*